United States Patent
Chung

(10) Patent No.: US 7,697,363 B2
(45) Date of Patent: Apr. 13, 2010

(54) MEMORY DEVICE HAVING DATA INPUT AND OUTPUT PORTS AND MEMORY MODULE AND MEMORY SYSTEM INCLUDING THE SAME

(75) Inventor: Hoe-Ju Chung, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 369 days.

(21) Appl. No.: 11/783,509

(22) Filed: Apr. 10, 2007

(65) Prior Publication Data

US 2007/0286011 A1 Dec. 13, 2007

(30) Foreign Application Priority Data

May 11, 2006 (KR) .................. 10-2006-0042624

(51) Int. Cl.
*G11C 8/00* (2006.01)

(52) U.S. Cl. .............. 365/230.05; 365/221; 365/219; 711/5; 711/148

(58) Field of Classification Search ............ 365/230.05, 365/230.09, 221, 52, 219; 711/5, 148
See application file for complete search history.

(56) References Cited

U.S. PATENT DOCUMENTS

| 7,463,535 B2 * | 12/2008 | Choi ............... 365/189.04 |
| 7,475,187 B2 * | 1/2009 | Gregorius et al. ........... 711/104 |
| 2002/0186591 A1 | 12/2002 | Lee et al. |
| 2006/0181944 A1 * | 8/2006 | Chung ............... 365/201 |
| 2007/0076479 A1 * | 4/2007 | Kim et al. .............. 365/185.11 |

FOREIGN PATENT DOCUMENTS

| JP | 2003122624 A | 4/2003 |
| JP | 2004146005 A | 5/2004 |
| KR | 1020020094354 A | 12/2002 |
| KR | 1020050095387 A | 9/2005 |

* cited by examiner

*Primary Examiner*—Anh Phung
*Assistant Examiner*—Toan Le
(74) *Attorney, Agent, or Firm*—Volentine & Whitt, PLLC

(57) ABSTRACT

A memory device is adapted to be connected in a daisy chain with a memory controller and one or more other memory devices. The memory device includes at least one data input port and at least one data output port for communicating data along the daisy-chain between the memory devices and the memory controller. The memory device is adapted to selectively enable/disable at least one of the data input or data output ports in response to whether a command received from the memory controller is intended for the memory device, or for one of the other memory devices.

47 Claims, 11 Drawing Sheets

| CLK | | | | | | |
|---|---|---|---|---|---|---|
| Pin0 | C0 | BA0 | A2 | A8 | RFU | | |
| Pin1 | C1 | BA1 | A3 | A9 | RFU | | |
| Pin2 | C2 | BA2 | A4 | A10 | | | |
| Pin3 | RFU | BA3 | A5 | A11 | | | |
| Pin4 | CS0 | A0 | A6 | A12 | | | |
| Pin5 | CS1 | A1 | A7 | A13 | | | |

FIG. 4

MEMORY DEVICE HAVING DATA INPUT AND OUTPUT PORTS AND MEMORY MODULE AND MEMORY SYSTEM INCLUDING THE SAME

BACKGROUND AND SUMMARY

1. Field

This invention relates, in general, to a memory device, and more particularly a memory device adapted to be connected in a daisy chain and having a data input port and output port that can be selectively enabled, and a memory module and memory system including the same.

2. Description

In general, a memory system includes a memory controller and a plurality of memory module connected to the memory controller. As memory systems having a higher density are demanded, an increasing number of memory modules are employed. Although a memory system with higher density can be obtained by using more memory modules, the capacitive loading of each of the signal lines between the memory controller and memory modules increases. This, in turn, limits the operating speed of the memory system. For this reason, the number of memory devices connected to one data signal line is limited, for example, to eight devices in a memory system employing synchronous dynamic random access memory (SDRAM) to four devices in a memory system employing double data rate (DDR) SDRAM, and to two devices in a memory system employing DDR2/3 SDRAM.

To solve the foregoing problem, a memory system employing a point-to-point (PTP) connection between a memory controller and a memory module has been adopted in memory system architectures. This arrangement is also sometimes referred to as a "daisy chain." Also, in this PTP arrangement, to increase the density of memory system the memory devices on one memory module employ a stacking package technology including lower memory device 132-1 and upper memory device 134-1 and each memory device is connected by the PTP arrangement.

FIG. 1A is a block diagram of an exemplary memory system 100 having a daisy chain structure. Memory system 100 includes a memory controller 110 and a memory module 120. Memory module 120 includes a plurality of memory groups 130-1~130-n. In turn, each memory group 130-i includes a primary memory device 132-i and a secondary memory device 134-I which are connected together in a daisy chain or PTP arrangement.

Memory controller 110 includes first output ports (Tx1~Txn) to output commands, addresses, and write data (C/A/WD) to memory module 120, and first input ports (Rx1~Rxn) to input read data from memory module 120.

In the memory system 100: C/A/WD indicates merged signal lines for command and addresses and write data for write operations; RD indicates read data lines for read operations; Rx_p indicates an input port of primary memory device 132-i; Rx_s indicates an input port of secondary memory device 134-i; Tx_p indicates an output port of primary memory device 132-I for sending command and addresses and write data; Tx_rdp indicates an output port of primary memory device 132-i for outputting read data; Rx_rdp indicates an input port of primary memory device 132-i; Rx_rds indicates an input port of secondary memory device 134-i for receiving read data; and Tx_rds indicates an output port of secondary memory device 134-i for outputting read data. The input ports Rx_rdp of primary memory devices 132-1~N are all disabled based upon the memory devices' connection as primary memory devices, rather than secondary memory devices, in the configuration of memory system 100.

Operationally, a read operation of memory system 100 will be explained with reference to FIG. 1A. Consider a case where data is being read out of a primary memory device 132-i to memory controller 110. In that case, read data of the memory device 132-i is transferred to memory controller 110 through the Tx_rdp port of primary memory device 132-i, the Rx_rds port of secondary memory device 134-i, and the Tx_rds port of secondary memory device 134-i, sequentially in that order.

Now, for a read data operation, the Rx_rds port and Tx_rds port of secondary memory device 134-i are always enabled or activated. That is, because secondary memory device 134-i doesn't know when a read operation for primary memory device 132-i occurs and when it will receive the read data from primary memory device 132-i and repeat the read data to memory controller 110, the circuits comprising the Rx_rds port and Tx_rds port of secondary memory device 134-i should always be in an operating condition.

Accordingly, power consumption in memory system 100 is larger than necessary and therefore wasted FIG. 1B is a block diagram of another exemplary memory system 150 having a daisy chain structure.

Memory system 150 is configured the same as memory system 100 of FIG. 1A, except for the following differences.

While the signal line for commands, addresses, and write data (C/A/WD) is merged in memory system, 100 of FIG. 1A, the signal lines for commands and addresses (C/A) and the signal lines for write data (WD) are separated from each other in memory system 150 of FIG. 1B.

Therefore, in memory system 150 of FIG. 1B, the input ports Rx_rdp of the primary memory devices 132-1~N are all enabled to receive write data from memory controller 110. Also in a write operation for writing data to secondary memory device 134-i, primary memory device 132-i repeats the write data from memory controller 110 to secondary memory device 134-i through the output port Tx_rdp of primary memory device 132-i.

That is, the input port Rx_rdp and the output port Tx_rdp of the primary memory device 132-i are always enabled or activated to repeat write data to secondary memory device 134-i because primary memory device 132-i doesn't know when it will have to repeat the write data and output the write data to secondary memory device 134-i.

Accordingly, power consumption in memory system 150 is larger than necessary and therefore wasted.

Accordingly, it would be advantageous to provide a memory device capable of selectively enabling/disabling an input port and/or an output port depending upon whether the port is needed for a current operation being performed in a memory system in which the memory device operates. It would also be advantageous to provide a memory module including a plurality of such memory devices. It would further be advantageous to provide a memory system including a plurality such a memory module including such a plurality of memory devices.

In one aspect of the invention, a memory device is adapted to be connected in a daisy chain with a memory controller and one or more other memory devices. The memory device comprises: a plurality of memory cells; a data input port adapted to receive read data; a data output port adapted to output the read data; a command/address input port adapted to receive a command and address packet; a decoder adapted to receive and decode the command and address packet and to output one or more detection signals, wherein when the command and address packet includes a read command, the one or more detection signals indicate whether the read command is intended for memory cells of the memory device, or for another memory device in the daisy chain; and a port controller adapted to selectively enable and disable at least one of the data input port and the data output port in response to at least one of the one or more detection signals from the decoder.

In another aspect of the invention, a memory module comprises a plurality of memory devices connected in a daisy chain. Each memory device comprises: a plurality of memory cells; a data input port adapted to receive read data; a data output port adapted to output the read data; a command/address input port adapted to receive a command and address packet; a decoder adapted to receive and decode the command and address packet and to output one or more detection signals, wherein when the command and address packet includes a read command the one or more detection signals indicate whether the read command is intended for memory cells of the memory device, or for one of the other memory device(s) in the daisy chain; and a port controller adapted to selectively enable and disable at least one of the data input port and the data output port in response to at least one of the one or more detection signals from the decoder.

In a further aspect of the invention, a memory system includes: a memory controller; and at least one memory module. Each memory module includes a plurality of memory devices connected in a daisy chain with the memory controller. Each memory device comprises: a plurality of memory cells; a data input port adapted to receive read data; a data output port adapted to output read data; a command/address input port adapted to receive a command and address packet; a decoder adapted to receive and decode the command and address packet and to output one or more detection signals, wherein when the command and address packet includes a read data command the one or more detection signals indicate whether the read data command is intended for memory cells of the memory device, or for one of the other memory device(s) in the daisy chain; and a port controller adapted to selectively enable and disable at least one of the data input port and the data output port in response to at least one detection signal from the decoder.

In yet another aspect of the invention, a memory device is adapted to be connected in a daisy chain with a memory controller and one or more other memory devices. The memory device includes at least one data input port and at least one data output port for communicating data along the daisy-chain between the memory devices and the memory controller. The memory device is adapted to selectively enable/disable at least one of the data input or data output ports in response to whether a command received from the memory controller is intended for the memory device, or for one of the other memory devices.

In still another aspect of the invention, a memory system includes: a memory controller; and at least one memory module. Each memory module includes a plurality of memory devices connected in a daisy chain with the memory controller. Each memory device includes at least one data input port and at least one data output port for communicating data along the daisy-chain between the memory devices and the memory controller, the memory device being adapted to selectively enable/disable at least one of the data input or data output ports in response to whether a command received from the memory controller is intended for the memory device, or for one of the other memory devices.

In a still further aspect of the invention, a memory device is adapted to be connected in a daisy chain with a memory controller and one or more other memory devices. The memory device comprises: a plurality of memory cells; a data input port adapted to receive read data; a data output port adapted to output read data; a command/address input port adapted to receive a command and address packet; a decoder adapted to receive and decode the command and address packet and to output a self read detection signal and a repeat read detection signal, wherein when the command and address packet includes a read command intended for memory cells of the memory device, then the self read detection signal is activated and the repeat read detection signal is inactivated, and when the command and address packet includes a read command intended for another memory device in the daisy chain which is connected to pass the read data to the memory controller through the memory device, then the self read detection signal is inactivated and the repeat read detection signal is activated; and a port controller adapted to selectively enable and disable at least one of the data input port and the data output port in response to at least one of the self read detection signal and the repeat read detection signal.

In an even further aspect of the invention, a memory device is adapted to be connected in a daisy chain with a memory controller and one or more other memory devices. The memory device comprises: a plurality of memory cells; a data input port adapted to receive write data; a data output port adapted to output the write data; a command/address input port adapted to receive a command and address packet; a decoder adapted to receive and decode the command and address packet and to output one or more detection signals, wherein when the command and address packet includes a write command the one or more detection signals indicate whether the write command is intended for memory cells of the memory device, or for one of the other memory device(s) in the daisy chain; and a port controller adapted to selectively enable and disable at least one of the data input port and the data output port in response to at least one detection signal from the decoder.

BRIEF DESCRIPTION OF THE DRAWINGS

FIG. 4 shows one embodiment of a command, address and write data (C/A/WD) packet format.

DETAILED DESCRIPTION

Figure 2:
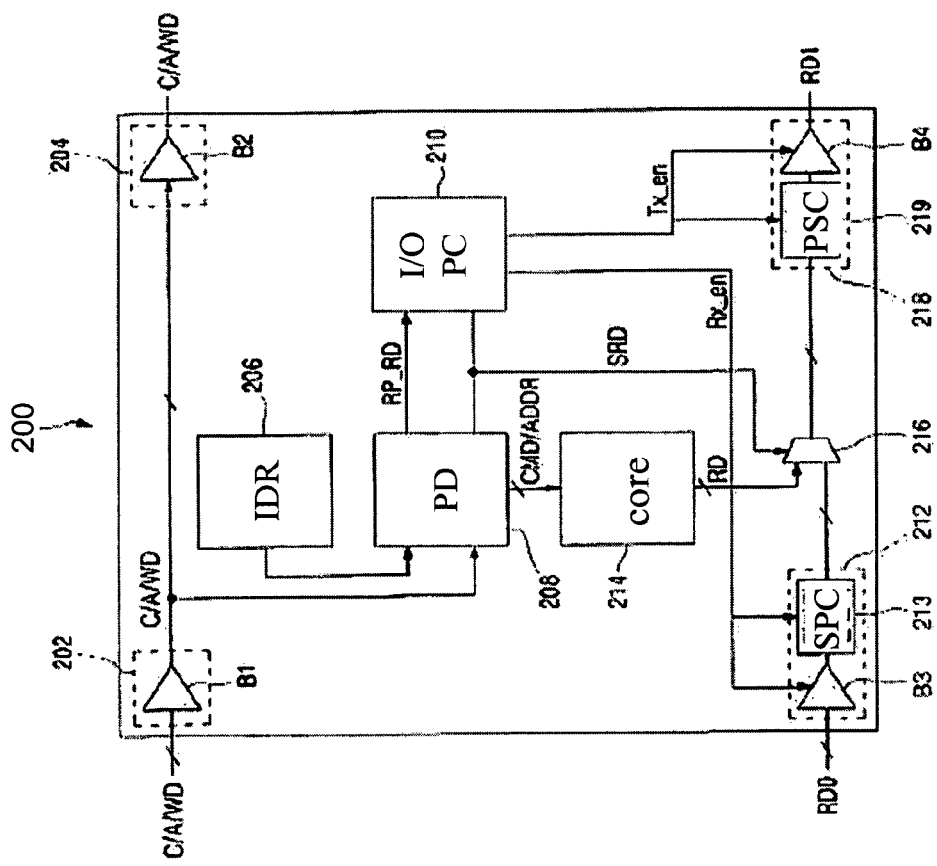
FIG. 2 is a functional block diagram of one embodiment of a memory device.

FIG. 2 is a functional block diagram of one embodiment of a memory device 200. Memory device 200 includes: first input port 202; first output port 204; ID register 206; packet decoder 208; port controller 210; data input port 212; memory core 214; selector 216; and data output port 218. First input port 202 includes buffer B1, and first output port 204 includes buffer B2. Data input port 212 includes buffer B3 and serial-to-parallel-converter (SPC) 213. Data output port 214 includes buffer B4 and parallel-to-serial-converter 219.

Referring to FIG. 2, when memory device 200 is used as a primary memory device in a daisy chain structure, then first input port 202 receives a command/address/write data (C/A/WD) packet from a memory controller, and generates an internal C/A/WD packet. On the other hand, when memory device 200 is not used as a primary memory device (e.g., is used as a secondary memory device), then first input port 202 receives a C/A/WD packet from a preceding memory device in the daisy chain (e.g., a primary memory device) and generates an internal C/A/WD packet.

First output port 204 receives the internal C/A/WD packet from first input port 202 and outputs the internal C/A/WD packet to a next memory device in the daisy chain. When memory device 200 is a last memory device in the daisy chain, then first output port 204 remains in a disabled state, perhaps by one or more pins on memory device 200 detecting a voltage level indicating the last device "slot" in the daisy chain. Other arrangements are of course possible.

ID Register 206 stores device identification information for the daisy chain structure in which memory device 200 is currently provided. For example, if a daisy chain includes four memory devices 200, then each memory device 200 stores one of "00", "01", "10" and "11" in ID Register 206. Again, memory device 200 may determine its position in the daisy chain by detecting a voltage level(s) on one or more pins of memory device 200, indicating the corresponding device "slot" in the daisy chain. Other arrangements are of course possible.

Packet decoder 208 receives the internal C/A/WD packet. In addition to command, address, and write data (in a data writing operation), a C/A/WD packet also includes device identification (ID) information. Packet decoder 208 compares the ID information included in the C/A/WD packet and the ID information stored in ID Register 206, and in response to the comparison generates command, address, and control signals (SRD, RP_RD) for operation of memory device 200.

The SRD signal is activated when the ID information included in the C/A/WD packet and the ID information stored in ID Register 206 are same, and the decoded command is for a read operation. That is, the SRD signal is activated to have a logic "high" state when a self read command is detected by packet decoder 208. On the other hand, the RP_RD signal is activated when the ID information included in the C/A/WD packet and the ID information stored in ID Register 206 are not same, and the decoded command is for read operation. That is, the RP_RD signal is activated to have a logic "high" state when a read command for another memory device is detected by packet decoder 208.

The point of time when the SRD signal is activated may be determined by a CL (CAS Latency) of memory device 200, and the duration for which the SRD signal is activated may be decided by a BL (Burst Length). CL is the time, measured as a number of clock cycles, from receiving a read command to outputting read data. BL is the number of data which is successively outputted or inputted to/from memory device.

The point of time when the RP_RD signal is activated may be determined by the CL (CAS Latency) of a preceding memory device in a daisy chain, and the time for repeating data between memory devices. The duration for which the RP_RD signal is activated may be determined by a BL (Burst Length) of a preceding memory device in the daisy chain.

Port controller 210 receives the SRD and RP_RD signals, and outputs data input port and data output port enable signals (Rx_en, Tx_en) for determining when data input port 212 and data output port 218 are enabled. In particular, the data input port enable signal (Rx_en) is activated in response to RP_RD, and the data output port enable signal (Tx_en) is activated in response to RP_RD or SRD.

As noted above, data input port 212 includes buffer B3 and a Serial-to-Parallel-Converter (SPC) 213 and is enabled by the Rx_en signal. SPC 213 parallelizes a serial read data packet from a preceding memory device in a daisy chain, and outputs 1st read data to a selector 216. If memory device 200 is used as a primary memory device, the circuits comprising data input port 212, i.e., the buffer B3 and SPC 213, are always disabled.

Memory core 214 outputs 2nd read data in response to the read command and address from packet decoder 208.

Selector 216 selects and outputs one of 1st read data and 2nd read data to the data output port is response to the SRD signal from packet decoder 208. That is, selector 216 outputs 2nd read data to data output port 218 when packet decoder 208 detects a self read command, and outputs 1st read data when packet decoder 208 detects a read command for another memory device.

As noted above, data output port 218 includes Parallel-to-Serial-Converter (PSC) 219 and buffer B4 and is enabled in response to the Tx_en signal. PSC 219 serializes the parallel read data from selector 216, and outputs the serial read data from memory device 200.

Figure 3:
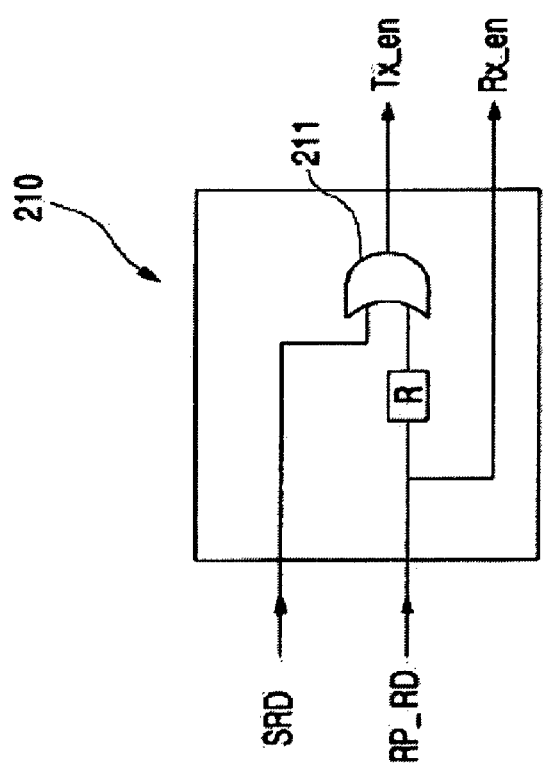
FIG. 3 shows one embodiment of a port controller that may be employed in the memory device of FIG. 2.

FIG. 3 shows one embodiment of port controller 210 that may be employed in the memory device of FIG. 2. Port controller 210 includes a delay element "R" and an OR logic gate 211. OR Logic gate activates the Tx_en signal to enable data output port 218 when either the SRD signal or the RP_RD is activated. Meanwhile the Rx_en signal is activated to enable data input port 212 when the RP_RD signal is activated. It is desirable for delay element "R" to have a delay that is less than the sum of the delay through data input port 212 and selector 216.

FIG. 4 shows one embodiment of a command, address, and write data (C/A/WD) packet format. As shown in FIG. 4, the C/A/WD packet can be transferred by 6 pins, and each pin may provide up to 8 bits of information synchronized with the clock signal. The C/A/WD packet may be for an active operation, a read operation, a write operation etc. If the C/A/WD packet is for write operation, the packet may be extended to include write data in the same manner.

The first bit of the C/A/WD packet includes a command type indicated C0~C2 and device identification information CS0~CS1. The second and third bits of the C/A/WD packet include BA0~BA3 address bits for bank addresses, and A0~A13 address bits to select a specific memory cell.

Figure 5A:
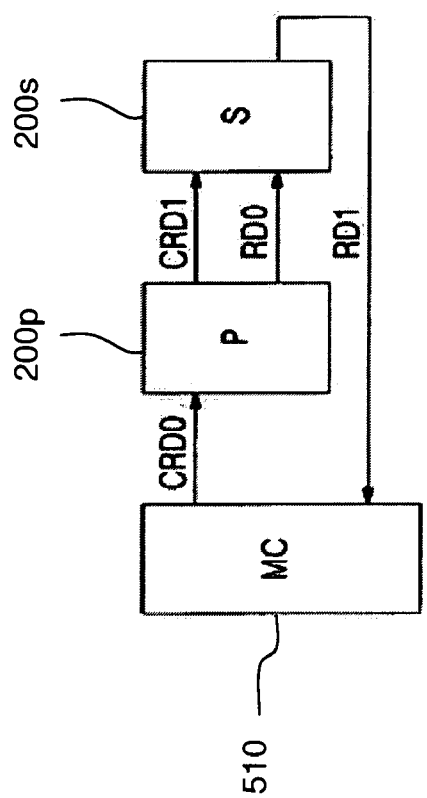
FIG. 5A is a high level block diagram of a memory system that may include the memory device of FIG. 2.

FIG. 5A is a high level block diagram of a memory system 500 that may include a memory device 200 as shown in FIG. 2.

Memory system 500 includes a memory controller 510 and a memory group having a primary memory device 200p and a secondary memory device 200s.

In FIG. 5A, CRD0 denotes a C/A/WD packet from memory controller 510 to primary memory device 200p, and CRD1 denotes a C/A/WD packet from primary memory device 200p to secondary memory device 200s. RD0 denotes read data from primary memory device 200p and RD1 denotes read data from secondary memory device 200s. RD1 can be RD0 when read operation is for primary memory device 200p.

Although FIG. 5A shows only one memory group, the memory system may include more than one memory group. Also, although each memory group of the memory system in FIG. 5A has two memory devices, this is used for illustrative purposes only and that the teaching of this invention can be extended to other memory group having more than two memory devices in a daisy chain.

Figure 5B:
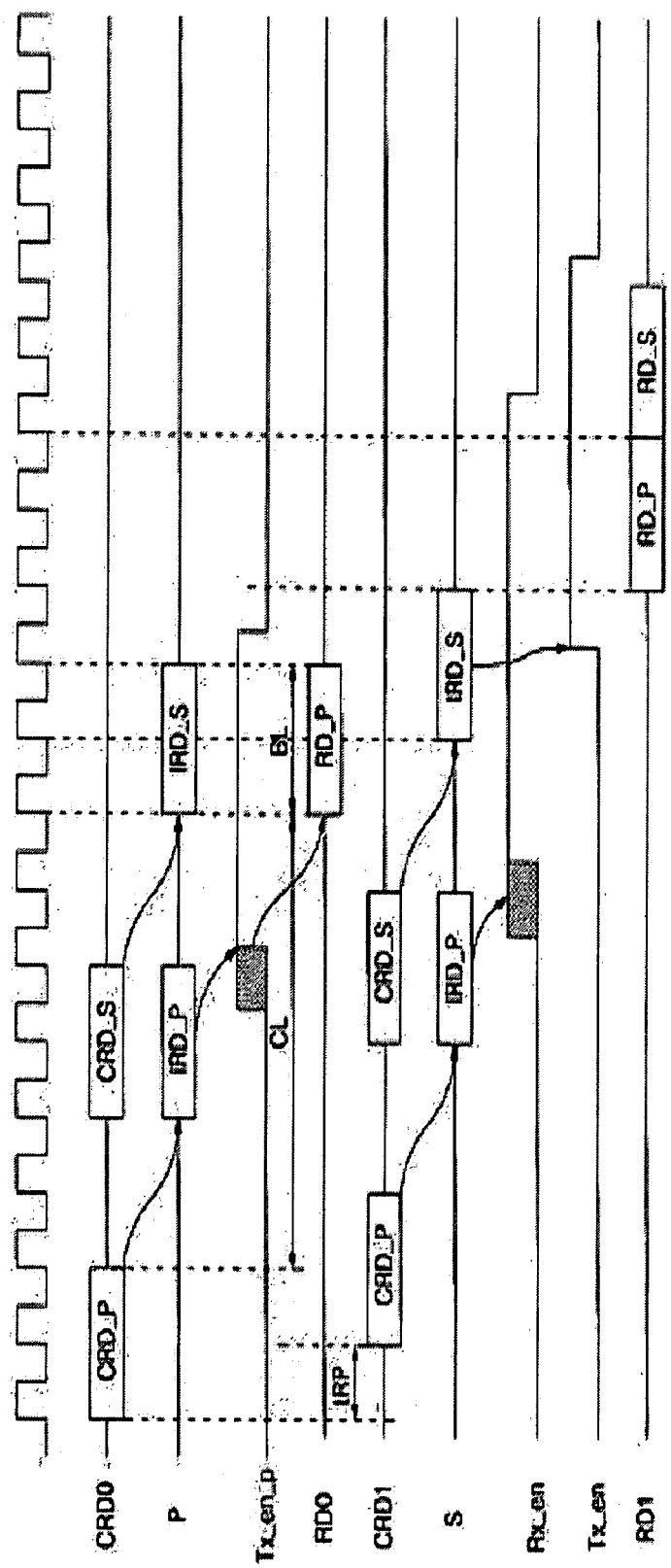
FIG. 5B is a timing diagram illustrating a read operation of the memory system of FIG. 5A.

FIG. 5B is a timing diagram illustrating a read operation of the memory system 500 of FIG. 5A.

In FIG. 5B, the CL and BL of primary memory device 200p and secondary memory device 200s are 6 clocks and 2 clocks respectively.

Referring to FIGS. 2-5, a successive read operation of primary and secondary memory devices 200p and 200s in memory system 500 will be explained.

Primary memory device 200p receives CRD_P and CRD_S successively and repeats and outputs the CRD_P and CRD_S. Packet decoder 208 decodes the CRD_P packet and activates the SRD_P signal because the device identification information included in the CRD_P and the identification information stored in IDR 206 of memory device 200p are the same.

The Tx_en signal of primary memory device 200p (Tx_en_p) is activated responsive to the SRD_P signal after a pre-determined time of the CL lapses. The duration of activation of Tx_en_p is long enough to output all of the read data as determined by the BL.

First read data (RD_0) from primary memory device 200p is transferred in response to the Tx_en_p signal to data input port 212 of secondary memory device 200s.

Secondary memory device 200s receives the CRD_P and CRD_S packets successively through primary memory device 200p after a repeating time delay tRP.

Secondary memory device 200s decodes the CRD_P packet, detects that the read command is for another memory device (i.e., primary memory device 200s) and activates the RP_RD_s signal. Port controller 210 of secondary memory device 200s activates the Rx_en and the Tx_en signals in response to the RP_RD_s signal. Data input port 212 of secondary memory device 200s receives the first read data (RD_0) and transfers RD_0 to data output port 218 through the selector 216. Data output port 218 of secondary memory device 200s outputs the RD_0 data to memory controller 510 in response to the Tx_en signal.

Also, secondary memory device 200s decodes the CRD_S packet, detects self read command and activates the SRD_s signal. Port controller 210 maintains the activation of the Tx_en signal in response to the SRD_s signal until the second read data RD_1 from primary memory device 200p is output to memory controller 510.

By the process outlined above, data output port 218 of secondary memory device 200s can output RD_0 and RD_1 packets successively to memory controller 510.

Accordingly, as the data input port and data output port of memory device 200 comprising a daisy chain structure can be selectively operated by detecting a command for other memory devices as well as commands for itself, power consumption of the data input and output ports can be reduced because the data input and output port operate only when they are needed.

Figure 1A:
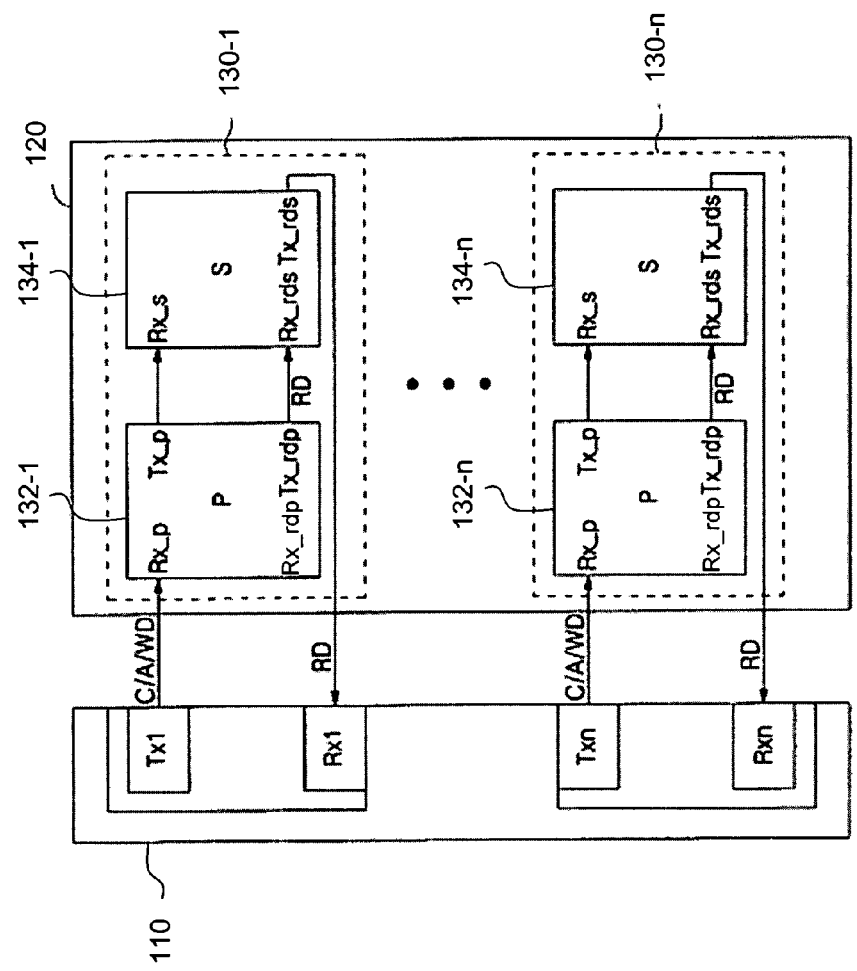
FIGS. 1A-B are block diagrams of two memory systems each having a daisy chain arrangement.
Figure 1B:
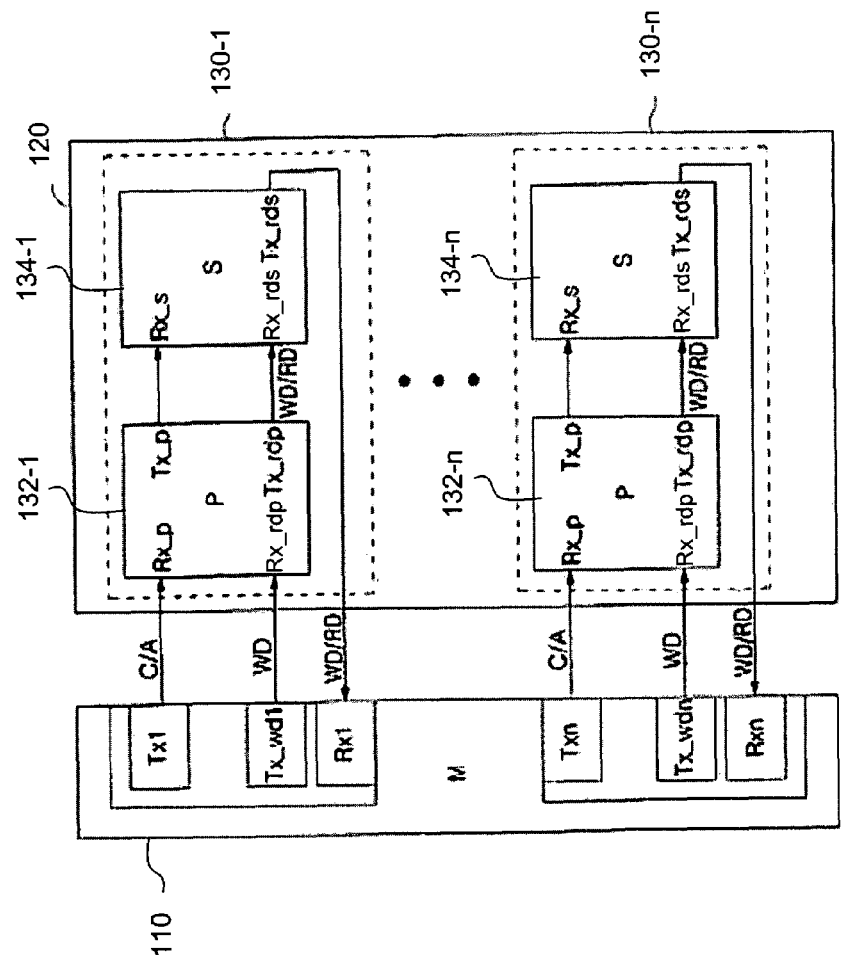
Figure 6:
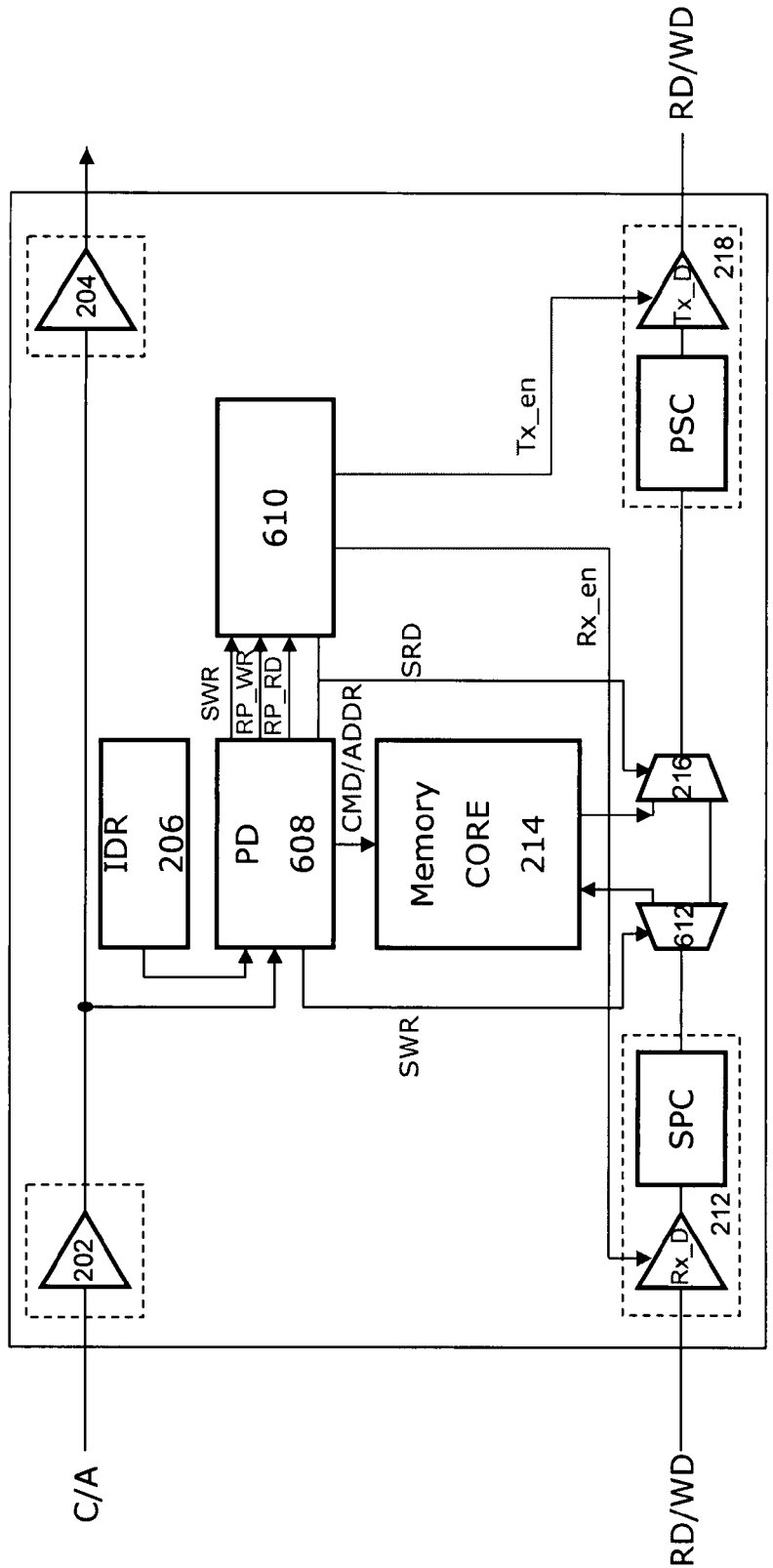
FIG. 6 is a functional block diagram of another embodiment of a memory device.

FIG. 6 is a functional block diagram of another embodiment of a memory device 600. The memory device 600 of FIG. 6 may be used in a memory system similar to memory system 150 of FIG. 1B, where the signal lines for commands and addresses (C/A) and the signal lines for write data (WD) are separated from each other. While the signal lines for commands and addresses, and the signal lines for write data are separated each other, the write data lines are merged with the read data lines. Accordingly, the interface for memory device 600 is different from for memory device 200.

Referring to FIG. 6, only the differences from memory device 200 will be explained.

Packet decoder 608 decodes a C/A packet and detects whether a write command is for its own memory device 600, or for another memory device. If the decoded command is for a write operation and the ID information in the C/A packet matches the ID information in IDR 206, then the SWR (self write) signal is activated. If the decoded command is for a write operation and the ID information in the C/A packet does not match the ID information in IDR 206, then the RP_WR (repeating write data) signal is activated.

Port controller 610 receives the SRD signal, the RP_RD signal, the SWR signal, and the RP_WR signal from packet decoder 608, and outputs Rx_en and Tx_en signals to data input port 212 and data output port 218, respectively. In addition, port controller 610 activates the Rx_en and Tx_en signals in response to the SRD signal and the RP_RD signal, as in the memory device 200 of FIG. 2, but it also activates the Rx_en signal when the SWR signal is activated, and activates the Rx_en and Tx_en signals when the RP_WR signal is activated.

The point of time when the Rx_en signal is activated in response to the SWR signal may be determined by the Write Latency (WL), and the duration of activation of the Rx en signal in response to SWR may be also decided by a Burst Length (BL). Also, the point of time when the Tx_en is activated in response to RP_WR signal may be decided by the WL and a repeating time, and the duration of activation of the Tx_en signal in response to the RP_WR signal may be also decided by a BL.

Data input port 212 of memory device 600 is the same as that of memory device 200 of FIG. 2. However, data input port 212 of memory device 600 receives write data (WD) from the memory controller when memory device 600 is used as a primary memory device, and receives write data from a preceding memory device in a daisy chain when it is not used as the primary memory device.

Switch 612 transfers the write data received from data input port 212 to memory core 214 or selector 216 in response to the SWR signal. That is, switch 612 transfers write data to memory core 213 only when a self write command is detected.

Selector 216 outputs self read data in response to the SRD signal only when a self read command is detected, otherwise it outputs the read data or write data from a preceding memory device in a daisy chain to either a subsequent memory device, or the memory controller in the case of a read command, when it is the last memory device in the daisy chain.

Figure 7A:
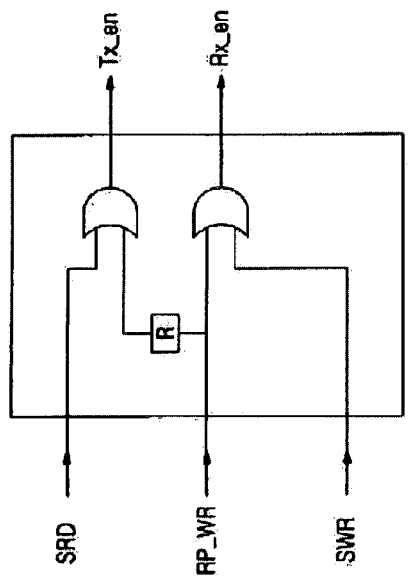
FIGS. 7A-B show two different embodiments of a port controller that might be employed in the memory device of FIG. 6.
Figure 7B:
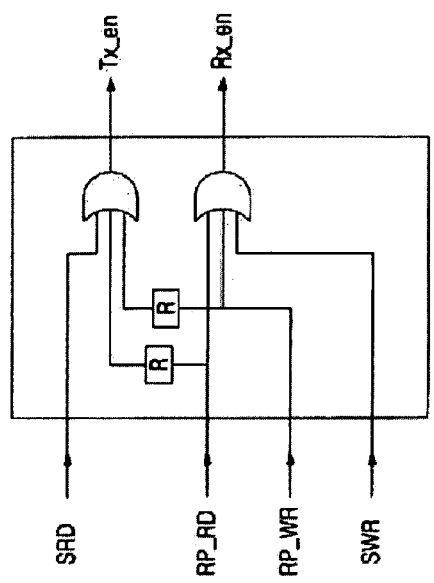

FIGS. 7A-B show two different embodiments of a port controller 610 that might be employed in the memory device of FIG. 6.

While FIG. 7A illustrates a configuration for port controller 610 when memory device 600 is used as a primary memory device in a daisy chain, FIG. 7B illustrates a configuration for port controller 610 when memory device is not used as a primary memory device.

Referring FIG. 7A, the Rx_en signal is activated in response to the SWR signal or the RP_WR signal, and the Tx_en signal is activated in response to the SRD signal or the RP_WR signal. The Tx_en signal can be activated through a delay element "R" after the RP_WR signal is activated. It is desirable for the delay element "R" to have a delay that is less than or equal to a delay equaling the sum of the delays of data input port 212, switch 612, and selector 216.

Referring FIG. 7B, the Rx_en signal is activated in response to the SWR signal, the RP_WR signal, and the RP_RD signal, and the Tx_en signal is activated in response to the SRD signal, the RP_RD signal, and the RP_WR signal. The Tx_en signal can be activated through a delay element "R" after the RP_WR signal or the RP_RD signal is activated. It is desirable for the delay element "R" to have a delay that is less than or the same as the sum of the delays of data input port 212, switch 612, and selector 216.

Figure 8A:
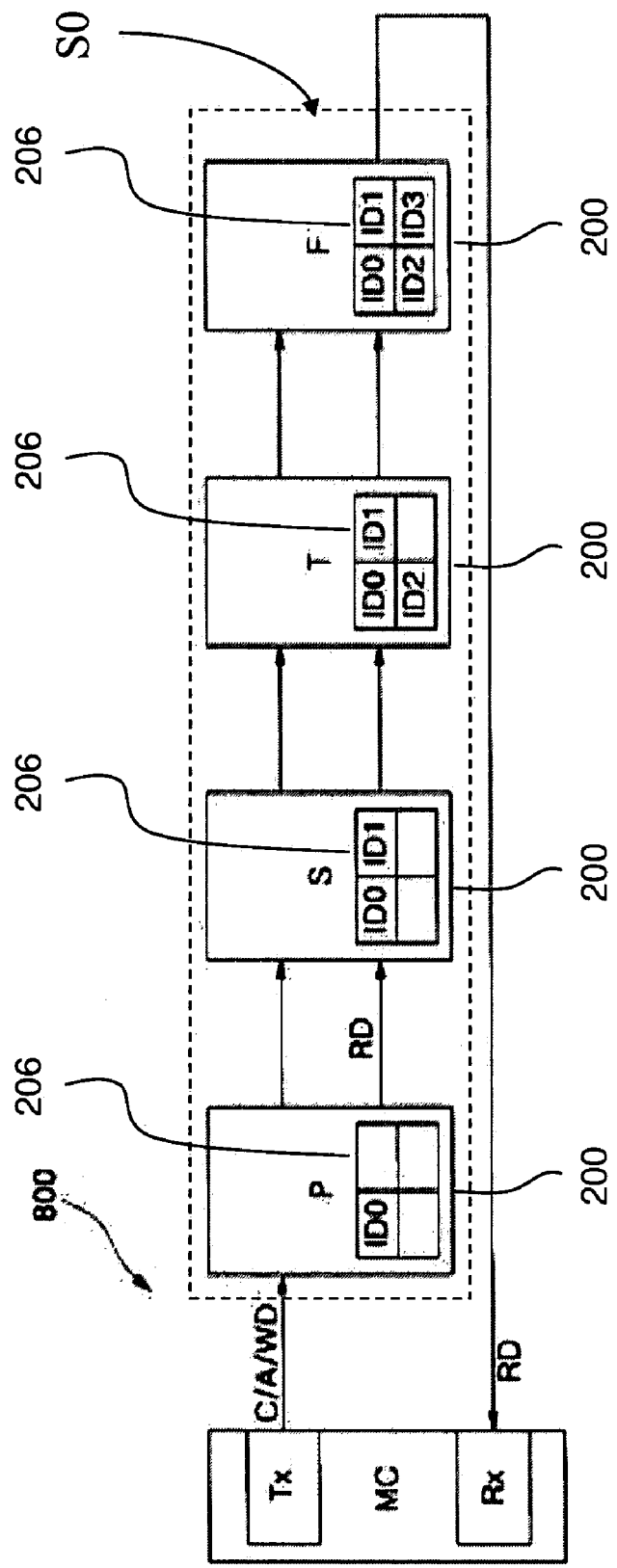
FIG. 8A shows a block diagram of one embodiment of a memory system, which might include the memory device of FIG. 2.

FIG. 8A shows a block diagram of one embodiment of a memory system 800, which might include the memory device 200 of FIG. 2.

Although the memory system 800 shows just one memory group (S0), in general the memory system may have a plurality of memory groups.

Memory group S0 of memory system 800 includes primary (P), secondary (S), third (T) and fourth (F) memory devices 200. IDR 206 of primary memory device 200 stores self ID information (ID0). IDR 206 of secondary memory device 200 stores self ID information (ID1) and ID information (ID0) of primary memory device 200. IDR 206 of third memory device 200 stores: self ID information (ID2), ID information (ID0) of primary memory device 200, and ID information (ID1) of secondary memory device 200. IDR 206 of fourth memory device 200 stores: self ID information (ID3), ID information (ID0) of primary memory device 200, ID information (ID1) of secondary memory device 200, and ID information (ID2) of third memory device 200.

Each memory device 200 compares device identification information included in a command packet and stored ID information in IDR 206 of the memory device 200 and determines form the comparison whether a read command is for itself or for another memory device in a daisy chain. Whether or not data input port 212 and/or data output port 218 should be enabled can be determined selectively by the result of the comparison.

For example, data input port 212 and data output port 218 of secondary memory device 200 can be enabled when secondary memory device 200 detects a read command for primary memory device 200. Also, data input port 212 and data output port 218 of third memory device 200 can be enabled when third memory device 200 detects a read command for primary memory device 200 or secondary memory device 200. Furthermore, data input port 212 and data output port 218 of fourth memory device 200 can be enabled when fourth memory device 200 detects a read command for primary memory device 200, secondary memory device 200, or third memory device 200.

Figure 8B:
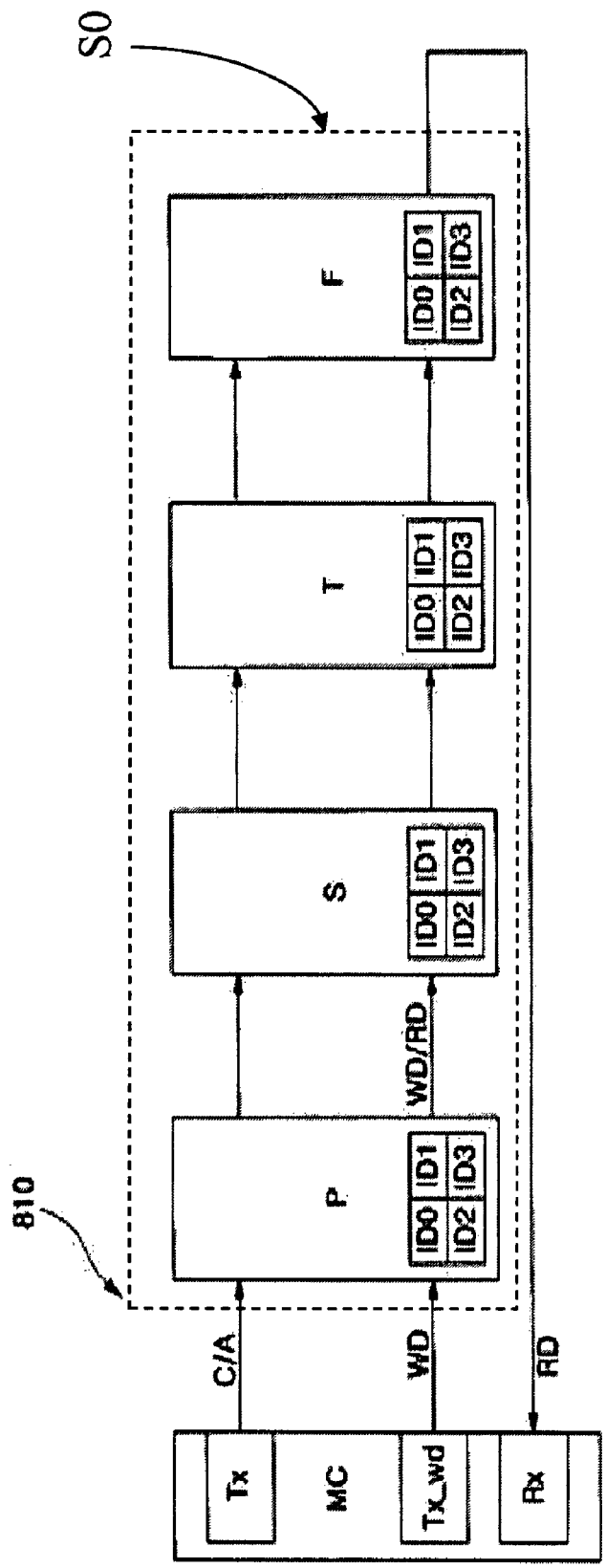
FIG. 8B shows a block diagram of a second embodiment of a memory system, which might include the memory device of FIG. 6.

FIG. 8B shows a block diagram of a second embodiment of a memory system, which might include the memory device 600 of FIG. 6.

Each of memory devices 600 comprising a daisy chain has an IDR 206 which stores all ID information of all of the memory devices 600 in the daisy chain.

Each memory device 600 compares device identification information included in a command packet, with the stored ID information, and determines as a result of that comparison whether a write command is for itself or another memory device, and also whether a read command is for itself or another memory device. Whether or not data input port 212 and/or data output port 218 should be enabled can be determined selectively by the result of the comparison when a read operation or a write operation is performed for a memory device 600 in the daisy chain.

For example, data input port 212 and data output port 218 of primary memory device 600 can be enabled when primary memory device 200 detects a write command for secondary memory device 600, or third memory device 600, or fourth memory device 600. Also, data input port 212 and data output port 218 of secondary memory device 600 can be enabled when secondary memory device 600 detects a write command for third memory device 600 or fourth memory device 600. Furthermore, data input port 212 and data output port 218 of third memory device 600 can be enabled when third memory device 600 detects a read command for fourth memory device 600.

As the number of memory devices in a daisy chain increase, the benefits described above also increase.

While preferred embodiments are disclosed herein, many variations are possible which remain within the concept and scope of the invention. Such variations would become clear to one of ordinary skill in the art after inspection of the specification, drawings and claims herein. The invention therefore is not to be restricted except within the scope of the appended claims.

We claim:

1. A memory device adapted to be connected in a daisy chain with a memory controller and one or more other memory devices, the memory device comprising:
   a plurality of memory cells;
   a data input port adapted to receive read data;
   a data output port adapted to output the read data;
   a command/address input port adapted to receive a command and address packet;
   a decoder adapted to receive and decode the command and address packet and to output one or more detection signals, wherein when the command and address packet includes a read command, the one or more detection signals indicate whether the read command is intended for memory cells of the memory device, or for another memory device in the daisy chain; and
   a port controller adapted to selectively enable and disable at least one of the data input port and the data output port in response to at least one of the one or more detection signals from the decoder.

2. The memory device of claim 1, further comprising a read data selector adapted to receive one of the one or more detection signals and in response thereto, to selectively output to the data output port one of: (1) read data from memory cells of the memory device; and (2) read data received at the data input port.

3. The memory device of claim 1, further comprising at least one ID register storing an ID identifying a position of the memory device in the daisy chain.

4. The memory device of claim 3, the decoder is adapted to compare the ID stored in the ID register to a device ID in the received command and address packet and to generate at least one of the one or more detection signals as a result of the comparison when the command and address packet includes a read command.

5. The memory device of claim 3, wherein the at least one register further stores IDs identifying the other memory devices in the daisy chain which pass read data to the memory controller through the memory device.

6. The memory device of claim 5, wherein when the command and address packet includes a read command, the decoder is adapted to compare the IDs stored in the ID register to a device ID in the received command and address packet and to generate at least one of the one or more detection signals as a result of the comparison.

7. The memory device of claim 1, wherein the port controller is adapted to disable the data input port and enable the data output port when the command and address packet includes a read command intended for memory cells of the memory device.

8. The memory device of claim 1, wherein the port controller is adapted to enable both the data input port and the data output port when the command and address packet includes a read command intended for one of the other memory devices in the daisy chain which is connected to pass the read data to the memory controller through the memory device.

9. The memory device of claim 1, wherein the port controller is adapted to disable both the data input port and the data output port when the command and address packet includes a read command intended for one of the other memory devices in the daisy chain which is not connected to pass the read data to the memory controller through the memory device.

10. The memory device of claim 1, wherein the data input port is also adapted to receive write data, the data output port is adapted to output write data, and wherein when the command and address packet includes a write command, then the one or more detection signals indicate whether the write command is intended for memory cells of the memory device, or for another memory device in the daisy chain.

11. The memory device of claim 10, further comprising a write data selector adapted to receive one of the one or more detection signals and in response thereto, to selectively provide write data from the data input port to one of: (1) selected memory cells of the memory device; and (2) the data output port.

12. The memory device of claim 10, further comprising at least one ID register storing an ID identifying a position of the memory device in the daisy chain, wherein the decoder is adapted to compare the ID stored in the ID register to a device ID in the received command and address packet and to generate at least one of the one or more detection signals as a result of the comparison when the command and address packet includes a write data command.

13. The memory device of claim 12, wherein the at least one ID register further stores IDs identifying the other memory devices in the daisy chain which receive write data from the memory controller through the memory device.

14. The memory device of claim 13, wherein the decoder is adapted to compare the IDs stored in the ID register to a device ID in the received command and address packet and to generate at least one of the one or more detection signals as a result of the comparison when the command and address packet includes a write command.

15. The memory device of claim 10, wherein the port controller is adapted to enable the data input port and disable the data output port when the command and address packet includes a write command intended for memory cells of the memory device.

16. The memory device of claim 10, wherein the port controller is adapted to enable both the data input port and the data output port when the command and address packet includes a write command intended for one of the other memory devices in the daisy chain which is connected to receive write data from the memory controller through the memory device.

17. The memory device of claim 10, wherein the port controller is adapted to disable both the data input port and the data output port when the command and address packet includes a write data command intended for one of the other memory devices in the daisy chain which is not connected to receive write data from the memory controller though the memory device.

18. A memory module, comprising a plurality of memory devices connected in a daisy chain, each said memory device comprising:
  a plurality of memory cells;
  a data input port adapted to receive read data;
  a data output port adapted to output the read data;
  a command/address input port adapted to receive a command and address packet;
  a decoder adapted to receive and decode the command and address packet and to output one or more detection signals, wherein when the command and address packet includes a read command, the one or more detection signals indicate whether the read command is intended for memory cells of the memory device, or for one of the other memory device(s) in the daisy chain; and
  a port controller adapted to selectively enable and disable at least one of the data input port and the data output port in response to at least one of the one or more detection signals from the decoder.

19. The memory module of claim 18, wherein each said memory device further comprises a read data selector adapted to receive one of the one or more detection signals and in response thereto, to selectively output to the data output port one of: (1) read data from memory cells of the memory device; and (2) read data received at the data input port.

20. The memory module of claim 18, wherein each said memory device further comprises at least one ID register storing an ID identifying a position of the memory device in the daisy chain.

21. The memory module of claim 18, wherein the data input port is also adapted to receive write data, the data output port is adapted to output write data, and wherein when the command and address packet includes a write command, then the one or more detection signals indicate whether the write command is intended for memory cells of the memory device, or for another memory device in the daisy chain.

22. The memory module of claim 21, wherein each said memory device further comprises at least one ID register storing an ID identifying a position of the memory device in the daisy chain, wherein the decoder is adapted to compare the ID stored in the ID register to a device ID in the received command and address packet and to generate at least one of the one or more detection signals as a result of the comparison when the command and address packet includes a write data command.

23. The memory module of claim 22, wherein the at least one ID register further stores IDs identifying the other memory devices in the daisy chain which receive write data from the memory controller through the memory device.

24. A memory system including:
  a memory controller; and
  at least one memory module, wherein each memory module includes a plurality of memory devices connected in a daisy chain with the memory controller,
  wherein each memory device comprises:
    a plurality of memory cells;
    a data input port adapted to receive read data;
    a data output port adapted to output read data;
    a command/address input port adapted to receive a command and address packet;
    a decoder adapted to receive and decode the command and address packet and to output one or more detection signals, wherein when the command and address packet includes a read data command, the one or more detection signals indicate whether the read data command is intended for memory cells of the memory device, or for one of the other memory device(s) in the daisy chain; and a port controller adapted to selectively enable and disable at least one of the data input port and the data output port in response to at least one detection signal from the decoder.

25. The memory system of claim 24, wherein each said memory device further comprises a read data selector adapted to receive one of the one or more detection signals and in response thereto, to selectively output to the data output port one of: (1) read data from memory cells of the memory device; and (2) read data received at the data input port.

26. The memory system of claim 24, wherein each said memory device further comprises at least one ID register storing an ID identifying a position of the memory device in the daisy chain.

27. The memory system of claim 24, wherein the data input port is also adapted to receive write data, the data output port is adapted to output write data, and wherein when the command and address packet includes a write command, then the one or more detection signals indicate whether the write command is intended for memory cells of the memory device or for another memory device in the daisy chain.

28. The memory system of claim 27, wherein each said memory device further comprises at least one ID register storing an ID identifying a position of the memory device in the daisy chain, wherein the decoder is adapted to compare the ID stored in the ID register to a device ID in the received command and address packet and to generate at least one of the one or more detection signals as a result of the comparison when the command and address packet includes a write data command.

29. The memory system of claim 28, wherein the at least one ID register further stores IDs identifying the other memory devices in the daisy chain which receive write data from the memory controller through the memory device.

30. A memory device adapted to be connected in a daisy chain with a memory controller and one or more other memory devices, wherein the memory device includes at least one data input port and at least one data output port for communicating data along the daisy-chain between the memory devices and the memory controller, the memory device being adapted to selectively enable/disable at least one of the data input or data output ports in response to whether a command received from the memory controller is intended for the memory device, or for one of the other memory devices, wherein the memory device disables the at least one data input port and enables the at least one data output port when the command indicates a read command for the memory device, and enables the at least one data input port and disables the at least one data output port when the command indicates a write command for the memory device.

31. The memory device of claim 30, wherein the memory device is adapted to compare an ID stored in a register of the memory device to a device ID in a received command and address packet including the command, and to selectively enable/disable at least one of the data input or data output ports in response to a result of the comparison.

32. A memory module including the memory device of claim 30.

33. The memory device of claim 30, wherein the memory device enables the at least one data input port and the at least one data output port when the command indicates the read command for one of the other memory devices prior to the memory device, and disables the at least one data input port and the at least one data output port when the command indicates the read command for one of the other memory devices subsequent to the memory device, disables the at least one data input port and the at least one data output port when the command indicates the read command for one of the other memory devices prior to the memory device, and enables the at least one data input port and the at least one data output port when the command indicates the read command for one of the other memory devices subsequent to the memory device.

34. A memory system including:
a memory controller; and
at least one memory module, wherein each memory module includes a plurality of memory devices connected in a daisy chain with the memory controller,
wherein each memory device includes at least one data input port and at least one data output port for communicating data along the daisy-chain between the memory devices and the memory controller, the memory device being adapted to selectively enable/disable at least one of the data input or data output ports in response to whether a command received from the memory controller is intended for the memory device, or for one of the other memory devices,
wherein the memory device disables the at least one data input port and enables the at least one data output port when the command indicates a read command for the memory device, and enables the at least one data input port and disables the at least one data output port when the command indicates a write command for the memory device.

35. The memory system of claim 34, wherein the memory device enables the at least one data input port and the at least one data output port when the command indicates the read command for one of the other memory devices prior to the memory device, and disables the at least one data input port and the at least one data output port when the command indicates the read command for one of the other memory devices subsequent to the memory device, disables the at least one data input port and the at least one data output port when the command indicates the read command for one of the other memory devices prior to the memory device, and enables the at least one data input port and the at least one data output port when the command indicates the read command for one of the other memory devices subsequent to the memory device.

36. A memory device adapted to be connected in a daisy chain with a memory controller and one or more other memory devices, the memory device comprising:
a plurality of memory cells;
a data input port adapted to receive read data;
a data output port adapted to output read data;
a command/address input port adapted to receive a command and address packet;
a decoder adapted to receive and decode the command and address packet and to output a self read detection signal and a repeat read detection signal, wherein when the command and address packet includes a read command intended for memory cells of the memory device, then the self read detection signal is activated and the repeat read detection signal is inactivated, and when the command and address packet includes a read command intended for another memory device in the daisy chain which is connected to pass the read data to the memory controller through the memory device, then the self read detection signal is inactivated and the repeat read detection signal is activated; and a port controller adapted to selectively enable and disable at least one of the data input port and the data output port in response to at least one of the self read detection signal and the repeat read detection signal.

37. The memory device of claim 36, wherein the port controller is adapted to output at least one of an input port enable signal for selectively enabling and disabling the data input port, and an output port enable signal for selectively enabling and disabling the data output port.

38. The memory device of claim 37, wherein the port controller is adapted to activate the input port enable signal in response to the self read detection signal being inactivated and the repeat read detection signal being activated, and otherwise to deactivate the input port enable signal.

39. The memory device of claim 37, wherein the port controller is adapted to activate the output port enable signal in response to one of the self read detection and the repeat read detection signal being activated.

40. The memory device of claim 36, wherein when the command and address packet includes a read command intended for another memory device(s) in the daisy chain which is not connected to pass the read data to the memory controller through the memory device, then the self read detection signal is inactivated and the repeat read detection signal is inactivated.

41. The memory device of claim 40, wherein the port controller is adapted to output at least one of an input port enable signal for selectively enabling and disabling the data input port, and an output port enable signal for selectively enabling and disabling the data output port.

42. The memory device of claim 41, wherein the port controller is adapted to activate the input port enable signal in response to the self read detection signal being inactivated and the repeat read detection signal being inactivated.

43. The memory device of claim 36, wherein the self read detection signal is activated in response to CAS latency information stored in the memory device.

44. The memory device of claim 43, wherein the self read detection signal is deactivated in response to CAS latency information and burst length information stored in the memory device.

45. The memory device of claim 36, wherein the repeat read detection signal is activated in response to GAS latency information stored in the memory device.

46. The memory device of claim 45, wherein the repeat read detection signal is deactivated in response to CAS latency information and burst length information stored in the memory device.

47. A memory device adapted to be connected in a daisy chain with a memory controller and one or more other memory devices, the memory device comprising:
   a plurality of memory cells;
   a data input port adapted to receive write data;
   a data output port adapted to output the write data;
   a command/address input port adapted to receive a command and address packet;
   a decoder adapted to receive and decode the command and address packet and to output one or more detection signals, wherein when the command and address packet includes a write command, the one or more detection signals indicate whether the write command is intended for memory cells of the memory device, or for one of the other memory device(s) in the daisy chain; and
   a port controller adapted to selectively enable and disable at least one of the data input port and the data output port in response to at least one detection signal from the decoder.

* * * * *